(12) United States Patent
Kelso et al.

(10) Patent No.: US 8,651,681 B2
(45) Date of Patent: Feb. 18, 2014

(54) LUMINESCENT CERAMIC CONVERTER AND LED CONTAINING SAME

(75) Inventors: John F. Kelso, Exeter, NH (US); Walter P. Lapatovich, Boxford, MA (US)

(73) Assignee: Osram Sylvania Inc., Danvers, MA (US)

( * ) Notice: Subject to any disclaimer, the term of this patent is extended or adjusted under 35 U.S.C. 154(b) by 521 days.

(21) Appl. No.: 12/943,324

(22) Filed: Nov. 10, 2010

(65) Prior Publication Data

US 2012/0113617 A1 May 10, 2012

(51) Int. Cl.
*F21V 9/16* (2006.01)
*C09K 11/80* (2006.01)

(52) U.S. Cl.
USPC ............................................. 362/84; 428/690

(58) Field of Classification Search
USPC ......... 362/84, 34; 313/498, 501, 512; 257/98; 428/690; 252/301.4 R
See application file for complete search history.

(56) References Cited

U.S. PATENT DOCUMENTS

| 6,613,247 | B1 | 9/2003 | Hohn et al. |
| 6,653,765 | B1 | 11/2003 | Levinson et al. |
| 7,531,960 | B2 | 5/2009 | Shimizu et al. |
| 7,554,258 | B2 | 6/2009 | Rossner et al. |
| 7,717,589 | B2 * | 5/2010 | Nishioka et al. ............. 362/293 |
| 2004/0145308 | A1 | 7/2004 | Rossner et al. |
| 2007/0126017 | A1 * | 6/2007 | Krames et al. .................. 257/98 |
| 2008/0187746 | A1 | 8/2008 | De Graaf et al. |

FOREIGN PATENT DOCUMENTS

| WO | 2006087660 A1 | 8/2006 |
| WO | WO 2006/097876 A1 | 9/2006 |
| WO | 2007107917 | 9/2007 |
| WO | WO 2009/126272 A1 | 10/2009 |

* cited by examiner

*Primary Examiner* — Bao Q Truong
(74) *Attorney, Agent, or Firm* — Robert F. Clark

(57) ABSTRACT

There is herein described a luminescent ceramic converter that comprises a flat, monolithic piece of a ceramic material containing a luminescent species wherein a concentration of the luminescent species in a peripheral region of the converter is lower than in a central region of the converter.

8 Claims, 3 Drawing Sheets

LUMINESCENT CERAMIC CONVERTER AND LED CONTAINING SAME

TECHNICAL FIELD

This invention relates to light emitting devices and more particularly to light emitting diodes (LEDs). Still more particularly it relates to structures for converting the light emitted from LEDs into light of a different wavelength. In particular, this invention relates to making white-light-emitting LEDs.

BACKGROUND OF THE INVENTION

It is well known to use phosphors to convert blue light emitted from LEDs into longer wavelengths in order to affect the overall color of the light emitted from the LED package. See, e.g., U.S. Pat. Nos. 6,613,247 and 6,653,765. Such LEDs are generally referred to as phosphor-conversion LEDs (pc-LEDs). One very important application for pc-LEDs is the generation of white light in which a portion of the blue light emitted by the LED is converted into a yellow light by a phosphor embedded in the epoxy resin that encapsulates the LED. The combined effect of the remaining unconverted blue light and the converted yellow light is to produce an overall white light output from the pc-LED. Additional phosphors can be added to produce a warmer white color with a higher color rendering index (CRI). The preferred phosphor for white-emitting pc-LEDs is a yellow-emitting, cerium-activated yttrium aluminum garnet phosphor which can be represented by the formula $Y_3Al_5O_{12}:Ce^{3+}$, (YAG:Ce). The $Ce^{3+}$ luminescent species in the yttrium aluminum garnet (YAG) matrix absorbs in the blue region of the visible spectrum (420-490 nm) and re-emits the absorbed energy in the yellow at about 570 nm.

However, the use of phosphor powders in pc-LEDs is not without problems. In particular, it can be difficult to obtain uniform phosphor layers over the LED source leading to unacceptable color variations between LEDs. In addition, the phosphor particles embedded in an epoxy resin scatter the blue light emitted from the LED, which can reduce efficiency.

Another means of achieving a similar result in pc-LEDs is to use a solid, sintered ceramic converter instead of phosphor powders. Such solid, monolithic converters have at least two distinct advantages over phosphor powders. First, luminescent ceramic converters can be made in defined shapes and uniform thicknesses to provide better consistency and color control in manufacturing. Second, they can be made translucent which can reduce scattering losses and improve extraction efficiency. Examples of such luminescent ceramic converters are described in U.S. Pat. No. 7,554,258, U.S. Patent Application Publication 2007/0126017 and International Patent Application Publication No. WO 2006/087660.

Similar to the phosphor powders used in the pc-LEDs described above, the ceramic converters in white pc-LEDs are used to covert the light from the blue LED into a yellow light in order to produce an overall white light. Typically, the luminescent ceramic converter is a thin, flat plate approximately 1 mm square and less than 200 micrometers in thickness. The converter is fixed to the surface of the LED die so that the converter is in close proximity to the light-emitting surface. Like the phosphor-converted LEDs described above, the converter is preferably comprised of cerium-activated yttrium aluminum garnet, $Y_3Al_5O_{12}:Ce^{3+}$. Some gadolinium may also be incorporated into the YAG structure to slightly shift the emitted color more toward the red.

One targeted application for pc-LEDs using luminescent ceramic converters is automotive headlamps where the color uniformity of the beam projected on the road is an important consideration. In order to achieve this, the color of the light output by the pc-LED package must remain relatively constant as the viewing angle is changed. This is problematic for pc-LEDs that use highly translucent or transparent ceramic converters as the distances through which the blue light rays must travel within the converter become greater the more the viewing angle deviates from the surface normal. As a result, light emitted at an angle of 0° with respect to the surface normal will be bluer than light emitted at angles greater than 0° with respect to the surface normal.

One solution to reduce the difference in the angular color shift is to create a longer path length for all light rays by introducing scattering sites inside the ceramic converter. This can be achieved by leaving pores in the ceramic material as described in International Patent Application Publication No. WO 2007/107917 A2. However, as with phosphor powders, excessive scattering can result in an unacceptable loss of extraction efficiency. Moreover, the effectiveness of the scattering will be determined by both the number and size of the pores in the ceramic. If the number is too large, the light will be largely absorbed by internal scattering and the overall LED light output reduced. Light output is also reduced if the pore size distribution is not within a narrow optimal zone. In particular, it has been reported that the efficacy is optimal with 800 nm sized pores and that the efficacy drops off rapidly below 500 nm and steadily above 1000 nm. Achieving the optimal pore size distribution in a luminescent ceramic converter is difficult due to the thermodynamic and kinetic aspects of ceramic processing.

SUMMARY OF THE INVENTION

It is an object of the invention to obviate at least some of the disadvantages of the prior art enumerated above.

It is another object of the invention to improve the performance of pc-LEDs.

It is yet another object of the invention to provide improved LEDs for automotive headlight applications.

These objects are accomplished, in one aspect of the invention, by the provision of a luminescent ceramic converter that includes a flat, monolithic piece of a ceramic material containing a luminescent species wherein a concentration of the luminescent species in a peripheral region of the converter is lower than in a central region of the converter. In a preferred embodiment the ceramic material is paired with a blue-emitting LED to provide a device that emits white light.

In another aspect of the invention, there is provided a method of making a luminescent ceramic converter comprising the steps of: forming a ceramic material containing a substantially uniform concentration of a luminescent species; and treating said ceramic material in a manner to reduce the concentration of said luminescent species in a peripheral region thereof and complete said luminescent ceramic converter.

DETAILED DESCRIPTION OF THE INVENTION

Figure 1:
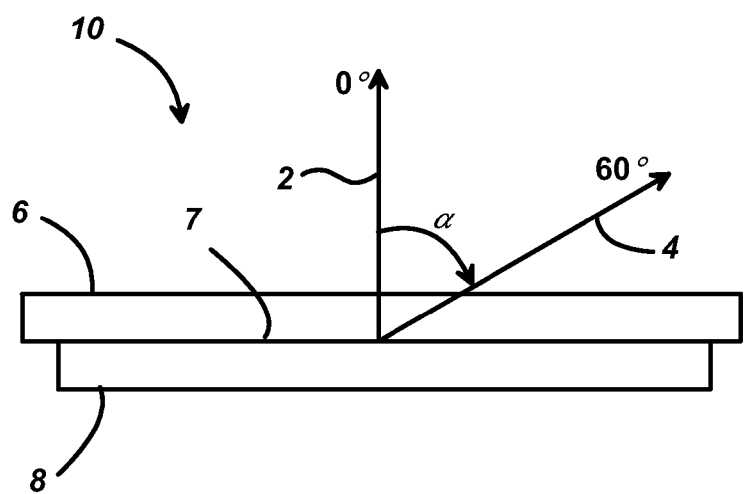
FIG. 1 is a schematic illustration of a light-emitting device utilizing an LED with a luminescent ceramic converter.

For a better understanding of the present invention, together with other and further objects, advantages and capabilities thereof, reference is made to the following disclosure and appended claims taken in conjunction with the above-described drawings.

For purposes of this application it is to be understood that when an element or layer is referred to as being "on," "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. The term "and/or" includes any and all combinations of one or more of the associated listed items.

Although the terms "first," "second," "third" etc. may be used to describe various elements, components, regions, layers and/or sections, these elements, components, regions, layers and/or sections are not to be limited by theses terms as they are used only to distinguish one element, component, region, layer or section from another element, component, region, layer or section. Thus, a first element, component, region, layer or section could be termed a second element, component, region, layer or section without departing from the scope and teachings of the present invention.

Spatially relative terms, such as "beneath," below," upper," "lower," "above" and the like may be used herein for ease of description to describe one element or feature's relationship to another element(s) or feature(s) as illustrated in the drawings. These spatially relative terms are intended to encompass different orientations of the device in use or operation in addition to the orientation shown in the drawings. For example, if the device in the drawings is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. For example, as used herein, the singular forms "a," "an" and "the" are intended to include the plural forms as well, unless the context clearly indicates otherwise. It will be further understood that the terms, "comprises" and/or "comprising," when used in this specification, specify the presence of stated features, integers, steps operations, elements, and/or components, but do not preclude the presence or addition of one or more other features, integers, steps, operations, elements, components, and/or groups thereof.

Referring now to the drawings with greater particularity, there is shown in FIG. 1 a pc-LED device 10 using a highly translucent or transparent ceramic converter plate 6 comprised of a host material and a luminescent species, for example, YAG:Ce, which pc-LED device 10 experiences a shift in color as the viewing angle increases. Light emitted from a point on the surface 7 of the blue-emitting LED 8 travels through the luminescent ceramic converter plate 6 during which some of the blue light is converted into yellow light. The color of the light eventually emitted from the surface of the converter plate 6 will depend on the ratio of the amount of unconverted blue light that passes through the converter to the amount of blue light that is converted to yellow light within the converter. This ratio in turn depends on the length of the path that the blue light rays must travel through the converter.

More particularly, the amount of absorption (and subsequent re-emission at longer wavelength) in the luminescent ceramic converter follows the Beer-Lambert Law:

$$I/I_o = 10^{-\epsilon ct}$$

where $I_o$ and $I$ are the intensities of the incident and transmitted light, respectively, $\epsilon$ is the molar absorptivity of the absorbing species, $c$ is the concentration of the absorbing species, and $t$ is path length through the material. Since the amount of conversion to yellow light has an exponential dependence on both concentration and path length, the longer the path length though the ceramic converter, the more blue light is absorbed and converted to yellow light for a constant concentration, c. For example, as shown in FIG. 1, light ray 2 traveling in a direction normal to the LED surface has a shorter path length through the ceramic converter plate 6 than light ray 4 traveling through the ceramic converter plate 6 at a larger viewing angle α, e.g., 60°. As a result, light emitted from the converter plate 6 in the direction of light ray 2 will be a bluer color, while light emitted in the direction of light ray 4 will be more yellow due to the longer path length within the converter.

Figure 2:
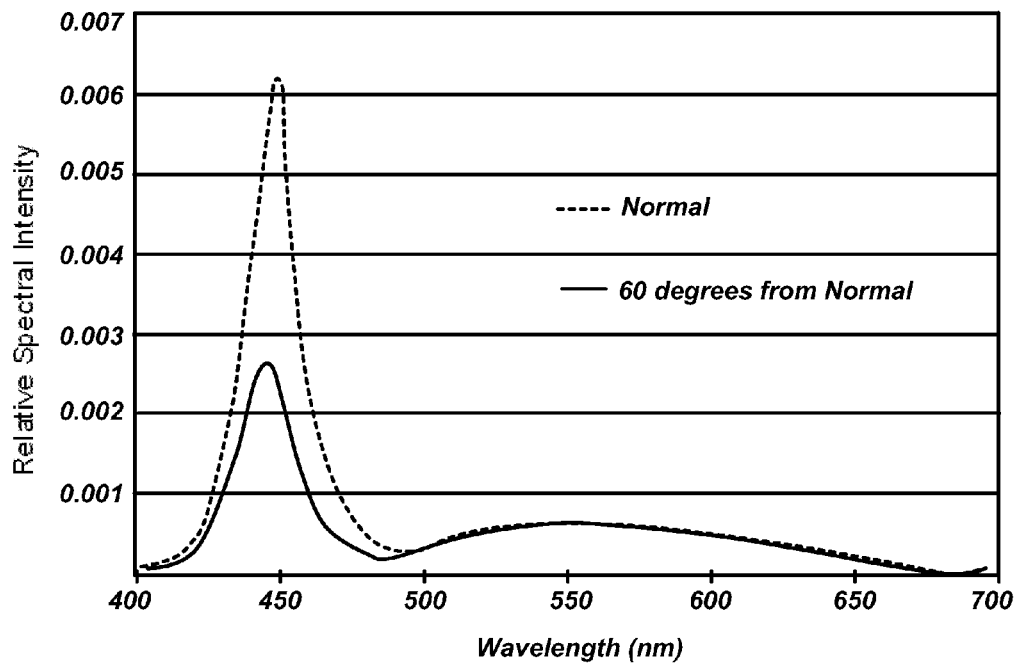
FIG. 2 is graph of the emission spectra of an LED with a luminescent ceramic converter at 0° and 60° viewing angles.

FIG. 2 demonstrates how the spectra for a YAG:Ce converter plate 6 on a 455 nm blue LED changes at a 60° viewing angle. (The spectra have been normalized at 550 nm.) The lower relative intensity of the blue 455 nm peak for the 60° viewing angle compared to the yellow emission centered around 550 nm makes the light at that angle appear less blue; i.e., more yellow than when viewed normal to the ceramic converter plate 6 surface. Ideally, it would be desirable to have the spectra at 0° and 60° to be nearly identical or in other words the ratio of the blue 455 nm peak to the yellow emission at 550 nm should be as close as possible at all viewing angles.

Figure 5A:
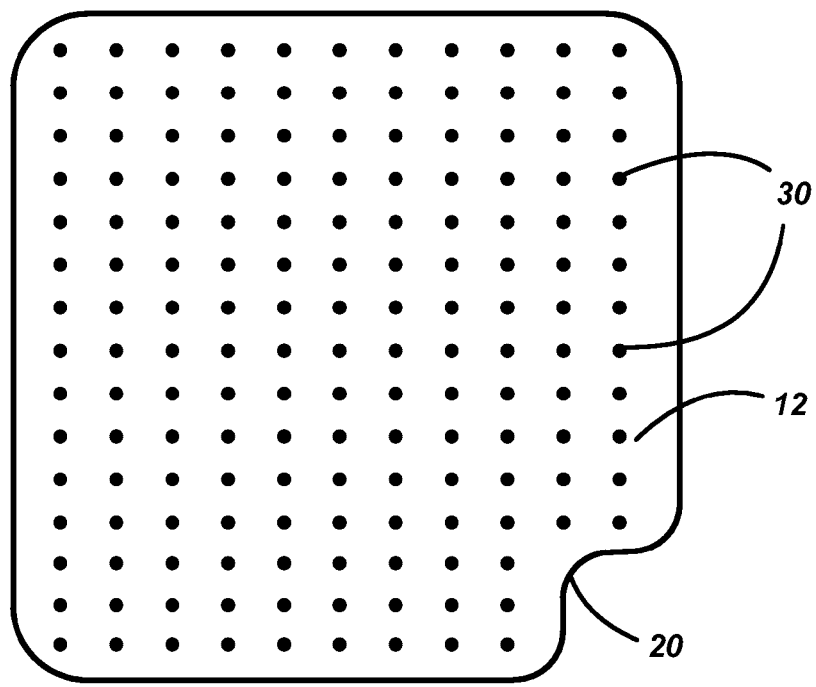
FIG. 5a is a diagrammatic view of a luminescent ceramic converter prior to treatment.
Figure 5B:
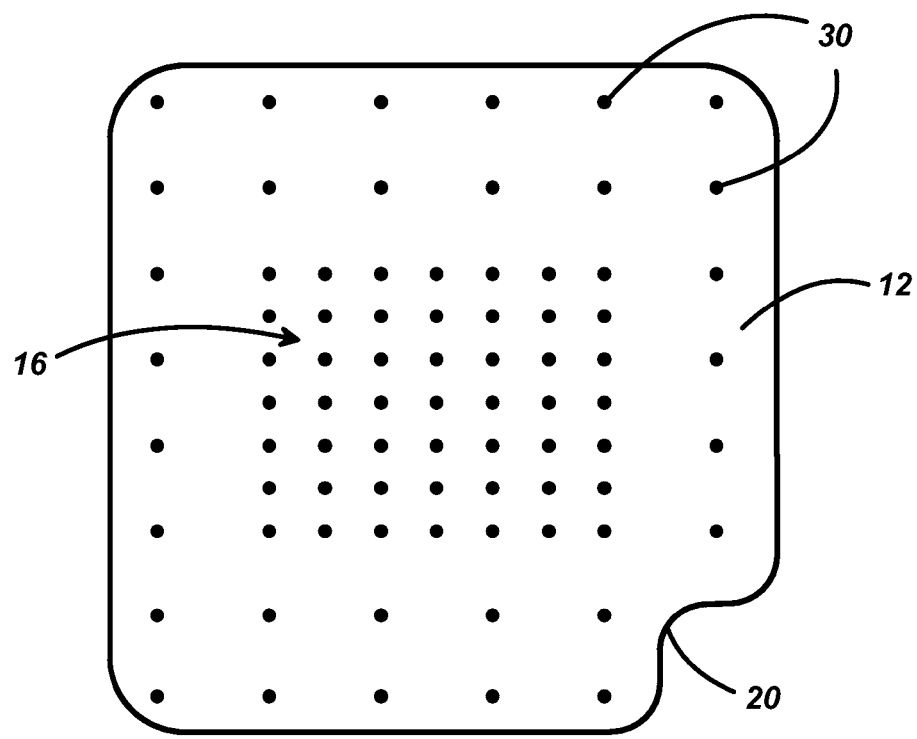
FIG. 5b is diagrammatic view of a luminescent ceramic converter subsequent to treatment.

With reference again to the Beer-Lambert law, the three factors capable of manipulation to change the ratio of incident light to transmitted light are: path length (thickness), concentration and molar absorptivity. The molar absorptivity is a function of the absorbing species and is thus fixed for a particular luminescent ceramic. And, while it might be possible to manipulate the thickness of the ceramic converter plate to correct the angular color shift, it is anticipated that this is likely to be difficult or expensive to achieve since the thickness of the ceramic converter plate typically is less than 200 micrometers. Instead, it has been discovered that it is possible to create a peripheral region in the ceramic converter plate that has a reduced concentration of the absorbing/luminescent species and that that feature can essentially eliminate the angular color shift. The ceramic converter plate 6 can initially be sintered to have a uniform concentration of the absorbing/luminescent species, for example, $Ce^{3+}$, throughout the part giving a uniform yellow appearance across the entire part. The part is subsequently heat treated in an atmosphere that oxidizes the $Ce^{3+}$ to $Ce^{4+}$ or that causes the $Ce^{3+}$ to diffuse out of and evaporate from the ceramic, leaving the ceramic with a concentration gradient of $Ce^{3+}$ that is higher in the center and lower at the edges. Thus, the center portion remains yellow while the edges appear white. This condition is diagrammatically illustrated in FIGS. 5a and 5b, where a luminescent species 30 is shown as being substantially uniformly distributed in FIG. 5a but having a lower peripheral concentration in FIG. 5b. Alternatively, the ceramic can be sintered at a temperature cycle in an atmosphere that concurrently sinters the ceramic and provides the concentration gradient. In yet another alternative embodiment for achieving the concentration gradient, a YAG precursor is sintered to form a platelet and then a small amount of Ce or $CeO_2$ is placed in the center of the platelet and the platelet is heated to diffuse the Ce into the YAG. The diffusion will lead to a concentration gradient.

Figure 3:
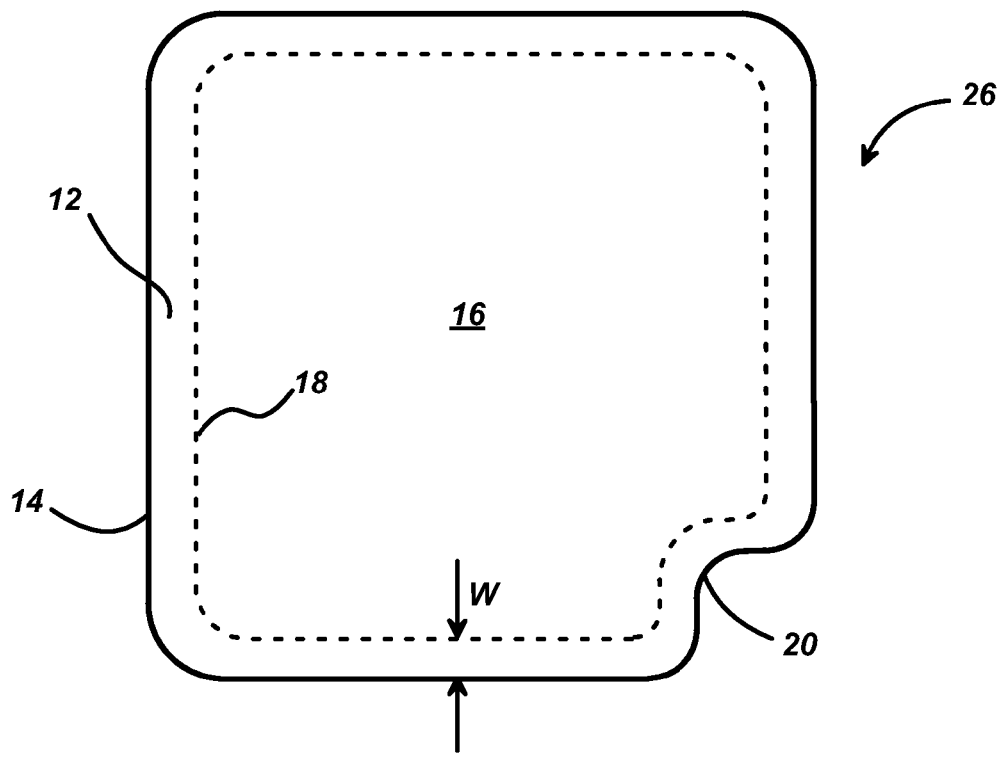
FIG. 3 is a plan view of a luminescent ceramic converter according to this invention.

With reference to FIG. 3, there is shown an embodiment of a luminescent ceramic converter plate 26 according to an aspect of the invention. The converter plate 26 is a flat, monolithic piece of a luminescent ceramic material. The luminescent ceramic material contains a luminescent species 30 (see FIGS. 5a and 5b) that is capable of converting light of a first wavelength emitted by an LED into light of a second wavelength. The converter plate 26 is preferably rectangular in shape and can have a notch 20 to allow for wire bonding to the top surface of an LED die. The typical desired shape for a luminescent ceramic converter plate 26 is about 1 mm×1 mm square with a thickness of 70 to 150 micrometers.

The ceramic converter plate 26 has a central region 16 that is bounded by dashed line 18 and a peripheral region 12 disposed between dashed line 18 and the edge 14 of the converter plate 26. In a preferred embodiment, the peripheral region 12 surrounds the central region 16 as shown in FIG. 3 and has a width W, which can be about 100 micrometers for a converter plate of area 1 $mm^2$. The size of the peripheral region depends, of course, upon the overall size of the plate and would increase as the area of the plate increases. As discussed above, the concentration of the luminescent species 30 is lower in the peripheral region, as shown diagrammatically in FIG. 5b. In a preferred embodiment, there is a concentration gradient in the peripheral region in which the concentration of the luminescent species decreases when moving from central region 16 to edge 14. The lower concentration of the luminescent species in the peripheral region reduces the amount of blue light that is converted to longer wavelengths at larger viewing angles and thereby reduces the shift in color with viewing angle.

In a more preferred embodiment, the luminescent ceramic converter plate 26 has a composition $(Y_{1-x}Ce_x)_3Al_5O_{12}$ wherein x is from 0.0015 to 0.0075. The decrease in the concentration of the luminescent species, $Ce^{3+}$, is marked by a change in the color of the YAG:Ce ceramic in the peripheral region of the converter. The normal yellow body color of the YAG:Ce ceramic which is observed in the central region becomes white in the peripheral region as one moves from the central region toward the edge of the converter. It makes no difference whether this decrease in the luminescent $Ce^{3+}$ species is caused by a shift in the oxidation state to a non-luminescent state, e.g., $Ce^{4+}$ or by a reduced amount of cerium in the YAG grains in the peripheral region. In either case, the effect is still a decrease in the concentration of the luminescent $Ce^{3+}$ species in the peripheral region.

Example

A luminescent ceramic converter plate according to an aspect of this invention is made from an oxide mixture of $Y_2O_3$ (45.52 g), $Al_2O_3$ (35.66 g), $Gd_2O_3$ (7.60 g) and $CeO_2$ (0.2168 g) that is combined with water; ammonium hydroxide; a binder, such as WB4101; a de-foamer, such as DF002; a polymeric dispersant, such as DS001; and a plasticizer, such as PL005. All of these materials are available from Polymer Innovations, Inc., Vista, Calif. 92081. A tape is cast with a blade gap setting of −0.8 mm and a 1.35 mm×1.35 mm part is punched from the tape. The part is pre-sintered in air using a time-temperature cycle of: 25° C. to 400° C. in 4 hours; 400° C. to 1150° C. in 4 hours; a 2 hour hold at 1150° C.; and cool down in 3 hours. The part is then placed on a molybdenum plate and final sintered in a dry 8% $N_2/H_2$ atmosphere at 1745° C. with a dwell time of about one hour. The furnace is an open-ended tunnel furnace, which does not provide complete separation of the atmosphere in the furnace from the air in the room. The resulting luminescent converter has a central yellow region and a white peripheral region that has a moderately etched appearance.

In an alternate embodiment a non-luminescent converter plate can be manufactured as described above, but without the addition of cerium. Subsequently, an amount of Ce or $CeO_2$ can be deployed on top of the non-luminescent host body to form a pre-converter and the pre-converter can be heated in an atmosphere and at a temperature sufficient to allow the Ce or the $CeO_2$ to diffuse into the non-luminescent host body and convert the Ce into a luminescent $Ce^{3+}$.

Figure 4:
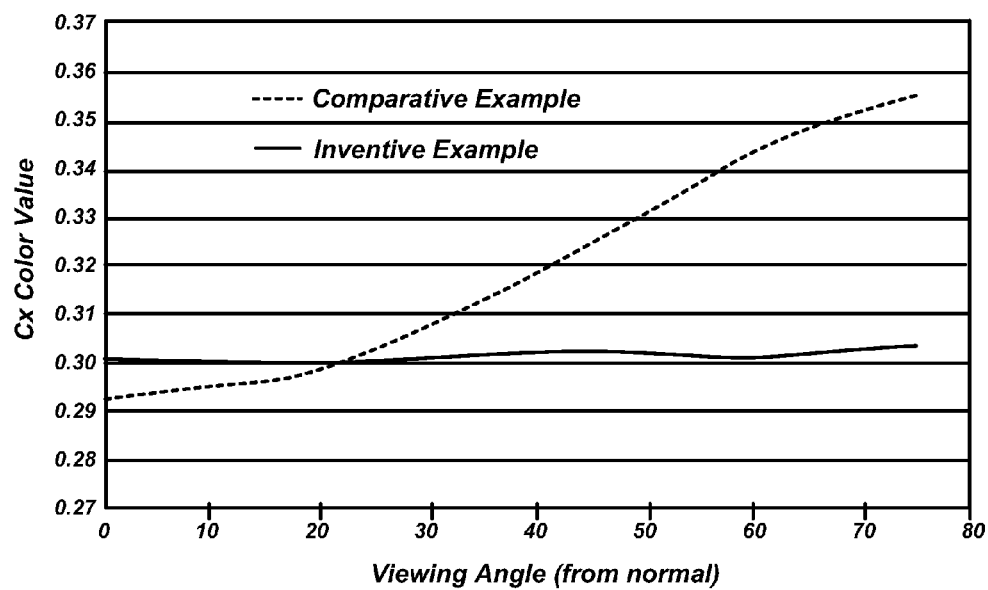
FIG. 4 is a comparison of the change in the 1931 CIE x color coordinate as a function of viewing angle for a conventional converter and a converter according to this invention.

FIG. 4 compares the change in the 1931 CIE x color coordinate as a function of viewing angle for a conventional YAG:Ce converter (Comparative Example) and a ceramic converter according to this invention (Inventive Example). (The conventional YAG:Ce converter has a generally uniform yellow color across the entire surface of the converter.) FIG. 4 shows a large variation in the CIE x coordinate for the conventional converter as the viewing angle increases from 0° to 70° whereas there is almost no variation in the CIE x color coordinate for the luminescent ceramic converter according to an aspect of this invention. The CIE y color coordinate varies proportionally with the CIE x color coordinate (i.e., they are linearly dependent between the x-y color for the blue LED and the x-y color for the converted yellow spectra).

While there have been shown and described what are at present considered to be preferred embodiments of the invention, it will be apparent to those skilled in the art that various changes and modifications can be made herein without departing from the scope of the invention as defined by the appended claims.

What is claimed is:

1. A luminescent ceramic converter comprising: a flat, monolithic piece of a ceramic material containing a luminescent species wherein a concentration of the luminescent species in a peripheral region of the converter is lower than in a central region of the converter, the ceramic material is yttrium aluminum garnet and the luminescent species is $Ce^{3+}$, and the converter has a substantially uniform concentration of cerium and at least a portion of the cerium in the peripheral region is $Ce^{4+}$.

2. The luminescent ceramic converter of claim 1 wherein the peripheral region has a width of less than about 100 micrometers and surrounds the central region of the converter.

3. The luminescent ceramic converter of claim 1 wherein the converter has a substantially rectangular shape.

4. A luminescent ceramic converter comprising: a flat, monolithic piece of a ceramic material containing a luminescent species wherein a concentration of the luminescent species in a peripheral region of the converter is lower than in a central region of the converter, the ceramic material is yttrium aluminum garnet and the luminescent species is $Ce^{3+}$, and the amount of the luminescent species in the peripheral region has been reduced by evaporation.

5. A method of making a luminescent ceramic converter comprising the steps of:

forming a ceramic material containing a substantially uniform concentration of a luminescent species; and treating said ceramic material by selectively evaporating a portion of said luminescent species to reduce the concentration of said luminescent species in a peripheral region thereof and complete said luminescent ceramic converter.

6. A light emitting device comprising:

a blue-light emitting LED; and a luminescent ceramic converter plate overlying said blue-light emitting LED, the converter plate comprising a flat, monolithic piece of a ceramic material containing a luminescent species wherein a concentration of the luminescent species in a peripheral region of the converter is lower than in a central region of the converter, the ceramic material is yttrium aluminum garnet and the luminescent species is $Ce^{3+}$, and wherein the converter has a substantially uniform concentration of cerium and at least a portion of the cerium in the peripheral region is $Ce^{4+}$.

7. The light-emitting device of claim 6 wherein the peripheral region has a width of less than about 100 micrometers and surrounds the central region of the converter.

8. The light-emitting device of claim 6 wherein the converter has a substantially rectangular shape.

* * * * *